United States Patent [19]

Sizer, II

[11] Patent Number: 5,206,878
[45] Date of Patent: Apr. 27, 1993

[54] WIDE STRIP DIODE LASER EMPLOYING A LENS

[75] Inventor: Theodore Sizer, II, Little Silver, N.J.

[73] Assignee: AT&T Bell Laboratories, Murray Hill, N.J.

[21] Appl. No.: 774,929

[22] Filed: Oct. 11, 1991

[51] Int. Cl.$^5$ ............................................... H01S 3/08
[52] U.S. Cl. ...................................... 372/101; 372/92
[58] Field of Search .................... 372/92, 99, 101, 108

[56] References Cited

U.S. PATENT DOCUMENTS 5,081,639 1/1992 Snyder et al. ...................... 372/101

OTHER PUBLICATIONS

Cleo '91, Baltimore, Maryland, May 12–17, 1991, 'Cylindrical Microlenses for Collimating Laser Diodes, Snyder et al, Conference Proceedings, pp. 28–31.

"Solid State Laser Engineering", W. Koechner, Springer-Verlag, 1976, Section 5.1.2, pp. 176–178.

Primary Examiner—James W. Davie
Attorney, Agent, or Firm—Henry T. Brendzel

[57] ABSTRACT

An improved diode laser is attained by augmenting the conventional diode laser structure with a cylindrical lens that arrests the divergence of the beam in the spatial direction where it is rapidly diverging. To properly arrest the divergence of the beam and to thereby circularize it, the cylindrical lens is placed at a point in space where the size of the laser beam in the two orthogonal spatial directions is substantially the same. With proper selection of the lens' focal length, the nearly circular cross section of the light is maintained as it travels away from the diode laser. The diode laser is further improved by making the diode structure facet that is closest to the lens highly transmissive, and forming a partially reflective facet on the otherside of the lens. The elongates the resonance cavity.

12 Claims, 2 Drawing Sheets

WIDE STRIP DIODE LASER EMPLOYING A LENS

BACKGROUND OF THE INVENTION

This invention relates to diode lasers, and more particularly to the construction of wide strip diode lasers.

A diode laser is commonly created with a GaAs substrate which supports an electrical conductor and which has two parallel faces that are perpendicular to the substrate surface. An epitaxially grown layer of between 1 and 5 quantum wells is grown on the substrate surface and a strip that extends between the two faces is generally created by etching the quantum wells layer. A second epitaxial layer which also supports a second electrical conductor is grown (typically, also GaAs) to cover the quantom well strip. The two parallel faces are highly polished; with one being partially reflective and the other being either partially or highly reflective.

When an electrical current is forced through the conductors, the structure lases and light is emitted from the edge of the structure. Specifically, light is emitted from the partially reflective face of the structure in the area that corresponds to the cross section of the quantum wells strip. The light intensity is a function of the current level, but that light cannot be increased without bound by merely raising the current level because when the light is too intense it destroys the epitaxial material and/or the substrate. The overall light power that the diode laser emits can be increased, however, by widening the quantum wells strip.

The light emitted from a diode laser with a structure as described above does not have a circular cross section. Rather, it corresponds more closely to the shape of the cross section of the quantum wells strip. Consequently, diode lasers that achieve a high optical output through a wider strip possess a light beam that is far from circular. Moreover, the light from such a structure diverges very quickly in the plane perpendicular to the plane of the strip but diverges slowly in the plane of the strip. Thus, the light starts out roughly with a rectangular cross section having the long edge corresponding to the long edge of the strip, and as it travels away from the diode laser it eventually takes on an approximately rectangular cross section with a long edge that is perpendicular to the long edge of the strip.

At the CLEO '91 conference in Baltimore, Md., May 12-27, 1991, Snyder et al. reported on an approach to arrest the quick divergence of the beam in the perpendicular plane of the diode laser structure described above. "Cylindrical Microlenses for Collimating Laser Diodes", Snyder et al., Conference Proceedings, pp. 28-31. Their proposed structure comprises an optical fiber segment that is attached to the edge of the diode structure in parallel to the strip, as shown in FIG. 1. Diode laser 5 includes a quantum wells strip 10 spanning a substrate from partially reflective facet 20 to highly reflective facet 30. In FIG. 1, only the cross section of strip 10 at surface 20 is shown. A cylindrical lens 40 that is made of optical fiber is glued to the substrate at the light emitting output area of strip 10 (i.e., at facet 20) and that lens substantially collimates the diverging light in the vertical plane corresponding to the y-axis direction in FIG. 1. It does not collimate the light perpendicular to the diverging light corresponding to the z-axis direction in FIG. 1.

For applications where high intensities and small spot sizes are desired, there are three problems associated with this approach. First, the glue used to attach the lens to the substrate lowers the light intensity at which physical damage to the diode laser begins to show up. That occurs primarily because the glue absorbs light energy that is converted to heat. Second, the lens reduces the divergence rate of the rapidly expanding beam but it does not create a circular beam which may be focused to a small spot size. Third, the wider strip permits multimode operation of the laser and that results in variation in the light intensity along the strip. The latter two problems increase the minimum spot size that can be achieved from the diode laser and, together, the three problems cause the maximum *focused* intensity to be decreased.

SUMMARY OF THE INVENTION

The deficiencies of the prior art are overcome by modifying the partially reflective facet of the laser diode structure to be highly transmissive, by providing a partially reflective facet at a greater distant (thereby lengthening the cavity and reducing the likelihood of high spatial mode operation), and be providing a specifically designed lens.

More specifically, an improved diode laser is obtained by augmenting the conventional diode laser structure with a cylindrical lens that arrests the divergence of the beam in the spatial direction where it is rapidly diverging. To properly arrest the divergence of the beam and to thereby circularize it, the cylindrical lens is placed at a point in space where the size of the laser beam in the two orthogonal spatial directions is substantially the same. With proper selection of the lens' focal length, the nearly circular cross section of the light is maintained as it travels away from the diode laser.

The diode laser is further improved by making the diode structure facet that is closest to the lens highly transmissive, and forming a partially reflective facet on the otherside of the lens. This elongates the resonance cavity.

In one embodiment, for example, the lens is constructed by etching a refractive convex lens on a glass (or III-V semiconductor) substrate and positioning the lens substrate so that the back surface of the substrate forms the partially reflective facet that is needed to sustain lasing. Proper positioning of the lens with respect to the lasing structure is accomplished by appropriately recessing the lens.

DETAILED DESCRIPTION

Figure 2:
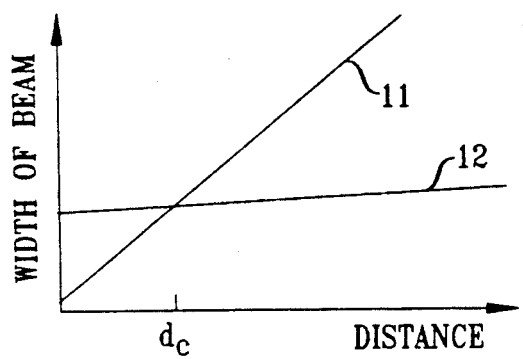
FIG. 2 presents a plot of beam divergence rates as a function of beam size.

It is well known that a light source with a small aperture diverges more quickly than a light source with a larger aperture. See, for example, "Solid State Laser Engineering", W. Koechner, Spring-Verlag, 1976, Section 5.1.2, pp. 176–178. This is illustrated diagrammatically in FIG. 2 where plot 11 depicts the divergence of the light beam from a narrow light source, and plot 12 depicts the divergence of the light beam from a wider light source. As indicated above, the primary technique for increasing the power capability of a laser diode to create a wider strip. However, that only increases the difference between the size of the light source when viewed in the two orthogonal directions that correspond to the width of the strip and the thickness of the strip (z-axis and y-axis directions, respectively). Regardless of the width of the strip, however, as can be seen from FIG. 2 there is always a distance, $d_c$, where the girth of the quickly diverging beam is equal to the girth of the slowly diverging beam. An image obtained at the distance $d_c$ is substantially circular.

Figure 3:
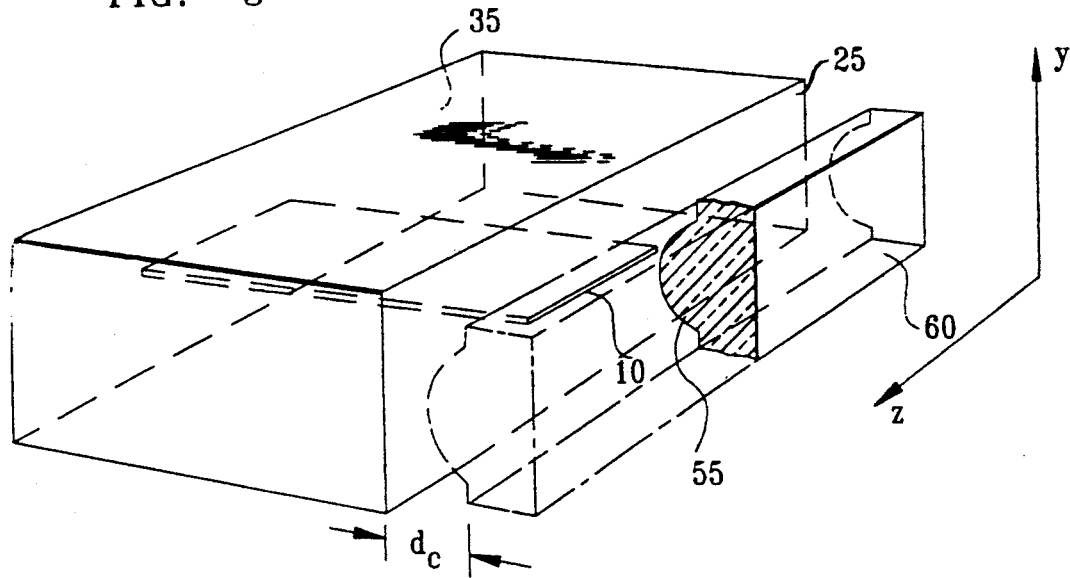
FIG. 3 depicts a laser diode construction in accord with the principles of the invention.

The circular cross section of the beam can be maintained from distance $d_c$ onward if the divergence of the beam in the two directions can be equalized. That is accomplished, in accordance with this invention, by placing an elongated lens at location $d_c$. The placed lens reduces the rate of beam divergence in the plane where it diverges quickly, i.e., in the y-axis direction, to match the divergence rate in the z-axis direction. An arrangement that accomplishes this desired effect is depicted in FIG. 3, where a lens is placed at distance $d_c$ away from the facet of the diode laser structure that emits light. The lens is a columnar lens which partially collimates lightly only in the y direction. More specifically, the FIG. 3 lens is column-like, with a column cross section that is perpendicular to an axis of the column (that is also parallel to the z axis in FIG. 3), and that cross section is shaped to arrest the divergence of the beam in the y axis. In the FIG. 3 lens, this cross section has a curved surface (as pointed to by numeral 55), which gives a convex columnar surface to the lens.

The divergence of Gaussian beams can be theoretically described through the use of Gaussian Beam Propagation equations (see above-cited reference). By using the Gaussian Beam Propagation equations, one can determine the focal length of a columnar lens which equalizes the beam divergence in both the x and y dimensions. Once the beam size and the beam divergence are equalized in both dimensions, the output beam remains circular at all subsequent distances. By "focal length" what is meant is the distance from a point source to a plane in the columnar lens (in the y-z plane), known as the principal plane, which causes the light of the points source to collimate along the y axis. In FIG. 3, the demarcation of distance $d_c$ indicates that the principal plane is approximately the plane that separates the convex portion of the lens from the rectangular portion of the lens.

Figure 1:
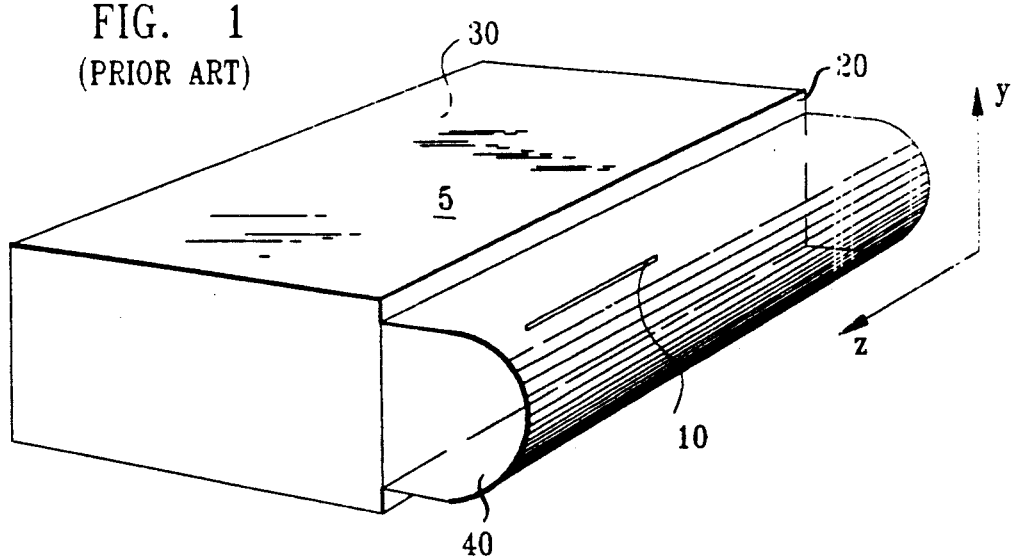
FIG. 1 illustrates a prior art construction of a laser diode and a post-emission cylindrical lens for collimating the light output.

FIG. 3 illustrates a structure that is similar to the FIG. 1 diode laser structure but which embodies the principles disclosed herein. It includes a broad strip quantum wells layer 10, a facet 25 and a facet 35. Facet 35 (hidden from view) is perpendicular to the plane of strip 10 and preferably is highly reflective. A columnar lens structure 55 is positioned at a distancd $d_c$ away from facet 25, with the long axis of the lens being parallel to facet 25 and to the plane of strip 10. Unlike lens 40 in the FIG. 1 drawing, the curved surface in structure 55 that makes up lens faces surface 25. Lens structure 55 also includes a surface 60 that is parallel to facet 35. In accordance with another aspect of the improved laser diode, surface 60 is partially reflective, while both surface 25 and the curved surface of the lens are highly transmissive.

The reason for making facet 25 highly transmissive relates to the fact that the broad strip structure permits high spatial mode operation of the laser diode. The light bouncing between the parallel facets of the diode structure can bounce at off-normal angles, and that causes the light intensity profile to be non-uniform along the z-axis direction. The non-uniform intensity profile is improved by lengthening the laser cavity, which in the FIG. 3 embodiment is accomplished by making surface 60 rather than facet 25 highly transmissive Facet 25 and the curved surface of the lens are made highly transmissive by applying an anti-reflective coating to the surfaces in a conventional manner. Of course, to make the entire arrangement lase, surface 60 needs to be positioned parallel to facet 35.

For the FIG. 3 embodiment, lens structure 55 can be created by etching a III-IV semiconductor or glass substrate to form a lens as described, for example, in a copending application by G. Derkits, Ser. No. 07/529,055 filed May 25, 1990, titled "Partially or Fully Recessed Microlens Fabrication", now U.S. Pat. No. 5,079,130. Lens 55 may be diffractive, a Fresnel lens, or a refractive lens as shown in FIG. 3. The latter is most efficient in performing the intended function.

Figure 4:
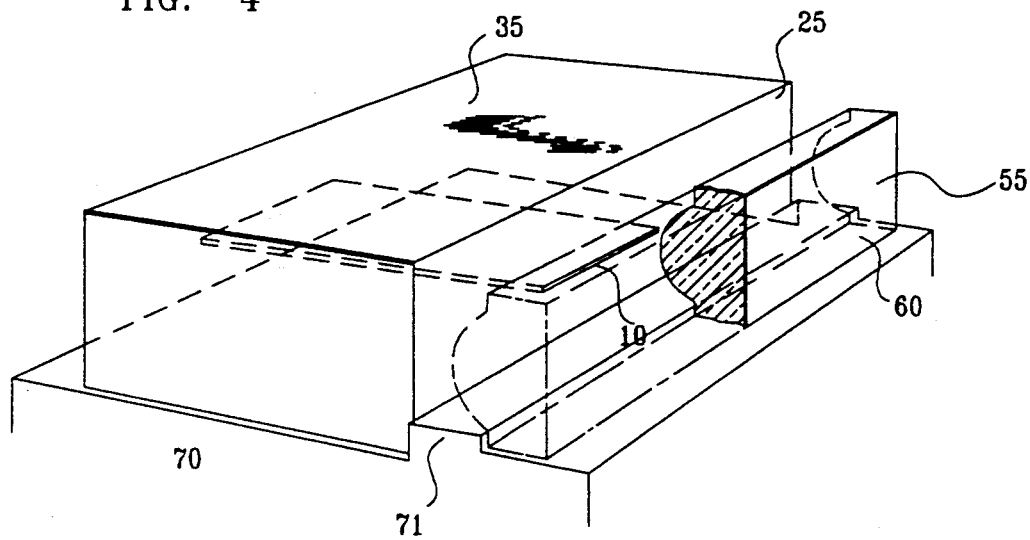
FIG. 4 illustrates one means for accurately positioning cylindrical lens/mirror structure relative to the lasing structure.
Figure 5:
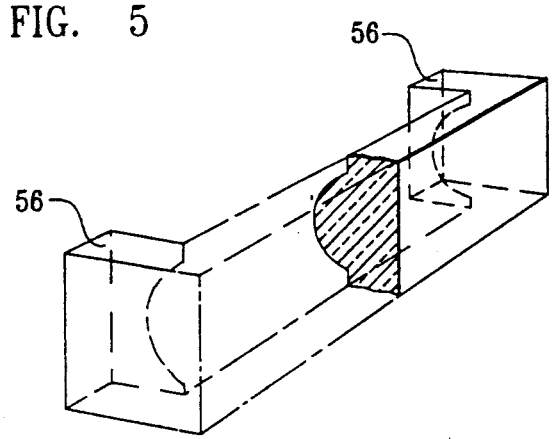
FIG. 5 depicts one approach for integrating both the lens and the positioning means.

From the above it may be appreciated that positioning of structure 55 with respect to strip 10 and facet 35 must be precise in two respects. Surface 60 must be parallel to facet 36 and the lens must be at distance $d_c$ from facet 25. There are numerous ways to effectuate this positioning. In FIG. 4, the laser diode structure and the lens structure are joined (e.g., cemented) to a heat sink 70 wherein a precisely machined ridge 71 serves as a guide for gluing the two structures in precise alignment. An alternative approach is presented in FIG. 5 where lens structure 55 is etched at a depth $d_c$ of the semiconductor or glass substrate to form two "legs" 56 of precise length ($d_c$). The "legs" permit cementing of the lens structure to the diode structure, such as with epoxy cement. Such cementing does not suffer from the deficiencies of the direct gluing technique of the FIG. 1 structure because the area of strip 10 on facet 25 is not contaminated with glue.

Figure 6:
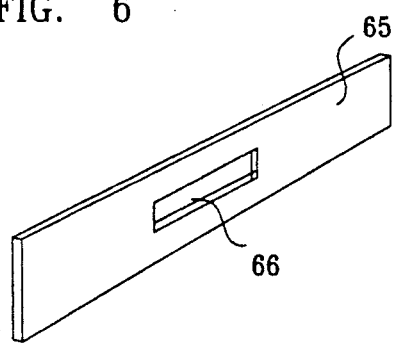
FIG. 6 presents another means for accurately positioning cylindrical lens/mirror structure relative to the lasing structure.

Still another approach is presented by FIG. 6 which depicts a spacer 65 (shown in a somewhat reduced scale). The spacer may be made of III-V semiconductor material with a hole (66) etched therein to provide the air packet that is necessary for the optical functioning of the lens. Again, spacer 65 may be cemented to the diode structure and the lens structure.

Figure 7:
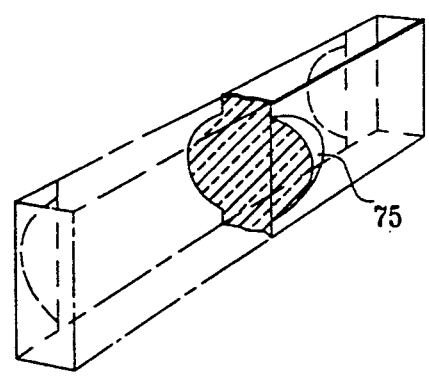
FIG. 7 shows an approach for including a collimating/focusing lens.

The beam emanating from partially reflecting surface 60 of the FIG. 3 structure is substantially circular, but it is still diverging. This beam may be collimated, or even focused with an additional lens that is positioned after surface 60. Alternatively, a "post-circularizing" lens can be created directly on structure 55 by growing a partially reflective coating on surface 60, growing an additional III-V material layer over the partially reflective coating, and etching of a focusing lens 75 therein, as depicted in FIG. 7.

We claim:

1. An external cavity diode laser having a broad quantum wells strip between a first facet, which is at least partially reflective, and a second facet parallel to said first facet, strip appears at the second facet with a cross section having a long measure along a first axis and a short measure along a second axis that is perpendicular to the first axis, and a focusing means having a columnar portion with a long dimension along a longitudinal axis and a cross section perpendicular to the longitudinal axis that arrest divergence of light along said second axis, situated in proximity to said second facet with its longitudinal axis parallel to said first axis, characterized in that a principal plane of said focusing means, lying in the plane of said first axis and said second axis, is situated approximately at a distance $d_c$ from said second facet, with $d_c$ being the distance from said second facet where the girth of a light beam emanating from said optically emitting area is substantially the same in the direction of said first axis and said second axis.

2. The diode laser of claim 1 where a light beam emanating from the cross section of the strip at the second facet diverges as it travels toward said lens and the focal length of said lens is set to equalize the rate of divergence of said light beam in the direction of said long edge and in a direction perpendicular to said long edge.

3. The diode laser of claim 1 further characterized in that said second facet is highly transmissive and a third facet is included following said focusing means which is parallel to said first facet and is at least partially reflective.

4. The diode laser of claim 3 further including a partially reflective layer associated with said third facet and a focusing lens following said third facet.

5. An external cavity diode laser, comprising:
   a broad strip diode laser structure with a first planar facet that is at least partially reflective, a second planar facet that is highly transmissive, and a quantum wells strip extending between said first and second facets and perpendicular to said first facet;
   a third facet that is at least a partially reflective surface, and parallel to said first facet; and
   a columnar lens with its long axis parallel to the plane of said strip and to the planes of said first facet, interposed between said broad strip laser structure and said partially reflective surface, at a distance from said highly transmissive facet to a principal place of the columnar lens where the ratio of the beam size in the plane parallel to the strip to the beam size in the plane perpendicular to the strip is substantially 1.

6. The laser of claim 5 comprising an anti-reflective coating over said columnar lens.

7. The laser of claim 5 whereas said columnar lens is a refractive lens.

8. The laser of claim 5 whereas said columnar lens is a diffractive lens.

9. The laser of claim 5 wherein a physical spacer is situated between said transmissive substrate and said laser structure.

10. The laser of claim 5 where the columnar lens is fabricated on one surface of a transmissive substrate and said third facet is fabricated on another surface of said transmissive substrate.

11. The laser claim 10 wherein said transmissive substrate includes a protrusion tailored to said distance.

12. The laser of claim 10 further including a base element with positioning means to affix said diode structure and said transmissive substrate structure in alignment with each other.

* * * * *